US010066296B2

(12) United States Patent
Woelk et al.

(10) Patent No.: US 10,066,296 B2
(45) Date of Patent: Sep. 4, 2018

(54) VAPOR DELIVERY DEVICE, METHODS OF MANUFACTURE AND METHODS OF USE THEREOF

(71) Applicant: Ceres Technologies, Inc., Saugerties, NY (US)

(72) Inventors: Egbert Woelk, North Andover, MA (US); Ronald L. DiCarlo, Jr., Danville, NH (US)

(73) Assignee: Ceres Technologies, Inc., Saugerties, NY (US)

( * ) Notice: Subject to any disclaimer, the term of this patent is extended or adjusted under 35 U.S.C. 154(b) by 0 days.

(21) Appl. No.: 14/990,843

(22) Filed: Jan. 8, 2016

(65) Prior Publication Data

US 2016/0122870 A1 May 5, 2016

Related U.S. Application Data

(62) Division of application No. 13/552,054, filed on Jul. 18, 2012, now Pat. No. 9,243,325.

(51) Int. Cl.
*C23C 16/455* (2006.01)
*C30B 25/14* (2006.01)
(Continued)

(52) U.S. Cl.
CPC ........ *C23C 16/45512* (2013.01); *B01F 3/028* (2013.01); *B01F 15/00331* (2013.01);
(Continued)

(58) Field of Classification Search
CPC ............. B01F 15/00331; B01F 3/0281; C23C 16/4481; C23C 16/4486; C23C 16/45512;
(Continued)

(56) References Cited

U.S. PATENT DOCUMENTS 1,407,791 A   2/1922  Fowler
5,080,131 A * 1/1992  Ono ..................... G01F 1/6842
                                                 137/486
(Continued)

FOREIGN PATENT DOCUMENTS

EP    2233603 A1    9/2010
JP    H09063965     3/1997
(Continued)

OTHER PUBLICATIONS

EP Exam Report for EP International Application No. 12166465.0 International Filing Date May 2, 2012; dated Sep. 27, 2012; 7 pages.
(Continued)

*Primary Examiner* — William McCalister
(74) *Attorney, Agent, or Firm* — Heslin Rothenberg Farley & Mesiti P.C.

(57) ABSTRACT

A method comprises transporting a first stream of a carrier gas to a delivery device that contains a liquid precursor compound. The method further comprises transporting a second stream of the carrier gas to a point downstream of the delivery device. The first stream after emanating from the delivery device and the second stream are combined to form a third stream, such that the dew point of the vapor of the liquid precursor compound in the third stream is lower than the temperature of the plumbing that transports the vapor to a CVD reactor or a plurality of CVD reactors. The flow direction of the first stream, the flow direction of the second stream and the flow direction of the third stream are unidirectional and are not opposed to each other.

8 Claims, 9 Drawing Sheets

(51) Int. Cl.
  *C23C 16/448* (2006.01)
  *C23C 16/52* (2006.01)
  *C30B 25/16* (2006.01)
  *B01F 3/02* (2006.01)
  *B01F 15/00* (2006.01)
  *C30B 29/40* (2006.01)

(52) U.S. Cl.
  CPC ...... *C23C 16/4481* (2013.01); *C23C 16/4486* (2013.01); *C23C 16/45561* (2013.01); *C23C 16/52* (2013.01); *C30B 25/14* (2013.01); *C30B 25/165* (2013.01); *C30B 29/40* (2013.01); *Y10T 137/0318* (2015.04); *Y10T 137/2509* (2015.04)

(58) Field of Classification Search
  CPC ... C23C 16/45561; C23C 16/52; C03B 25/14; C03B 25/165; C03B 29/40; Y10T 137/0318; Y10T 137/2499; Y10T 137/2501; Y10T 137/2509; Y10T 137/2559; Y10T 137/265; Y10T 137/2657; Y10T 137/2663; Y10T 137/7761
  USPC ............ 137/88, 89, 93, 109, 118.01, 118.04, 137/118.06, 487.5
  See application file for complete search history.

(56) References Cited

U.S. PATENT DOCUMENTS

| | | | |
|---|---|---|---|
| 5,553,395 A | 9/1996 | Wen et al. | |
| 5,648,113 A | 7/1997 | Barbee | |
| 5,730,181 A * | 3/1998 | Doyle | B01D 53/0415 137/487.5 |
| 6,027,760 A | 2/2000 | Gurer | |
| 6,216,726 B1 | 4/2001 | Brown et al. | |
| 6,338,759 B1 | 1/2002 | Yu et al. | |
| 6,424,800 B1 | 7/2002 | Kim | |
| 6,444,041 B2 | 9/2002 | Vaartstra | |
| 6,607,785 B2 | 8/2003 | Timmons et al. | |
| 6,637,475 B2 | 10/2003 | Noah et al. | |
| 6,868,869 B2 | 3/2005 | Orlander | |
| 6,880,592 B2 | 4/2005 | Gregg et al. | |
| 6,921,062 B2 | 7/2005 | Gregg et al. | |
| 7,673,856 B2 | 3/2010 | Toda et al. | |
| 7,722,720 B2 | 5/2010 | Shenai-Khatkhate et al. | |
| 7,975,718 B2 | 7/2011 | Ngo et al. | |
| 7,980,264 B2 | 7/2011 | Lynn | |
| 8,501,266 B2 | 8/2013 | Woelk et al. | |
| 8,776,821 B2 * | 7/2014 | Woelk | C23C 16/4481 137/487.5 |
| 8,997,775 B2 * | 4/2015 | Woelk | B01D 7/00 137/110 |
| 9,243,325 B2 * | 1/2016 | Woelk | C30B 25/14 |
| 9,416,452 B2 * | 8/2016 | Woelk | B01D 7/00 |
| 2002/0007849 A1 | 1/2002 | Wang et al. | |
| 2002/0189682 A1 * | 12/2002 | Linthorst | G01S 5/0009 137/487.5 |
| 2003/0072875 A1 | 4/2003 | Sandhu | |
| 2004/0007180 A1 | 1/2004 | Sandhu | |
| 2005/0095859 A1 * | 5/2005 | Chen | C23C 16/4481 438/689 |
| 2006/0115593 A1 | 6/2006 | Suzuki et al. | |
| 2006/0133955 A1 | 6/2006 | Peters | |
| 2006/0207503 A1 | 9/2006 | Meneghini | |
| 2007/0254093 A1 * | 11/2007 | Nijhawan | C23C 16/4482 427/8 |
| 2007/0266949 A1 | 11/2007 | Shenai-Khatkhate | |
| 2008/0044573 A1 | 2/2008 | Chen et al. | |
| 2008/0047607 A1 | 2/2008 | Horsky et al. | |
| 2008/0141937 A1 | 6/2008 | Clark et al. | |
| 2008/0168946 A1 | 7/2008 | Nam | |
| 2008/0251104 A1 | 10/2008 | Chen | |
| 2009/0130337 A1 | 5/2009 | Ovshinsky | |
| 2009/0214779 A1 | 8/2009 | Sarigiannis | |
| 2009/0255466 A1 | 10/2009 | Peck | |
| 2009/0258143 A1 | 10/2009 | Peck | |
| 2010/0063753 A1 | 3/2010 | Bour | |
| 2010/0117246 A1 | 5/2010 | Sarigiannis | |
| 2014/0020764 A1 | 1/2014 | Woelk | |
| 2014/0283917 A1 | 9/2014 | Woelk et al. | |

FOREIGN PATENT DOCUMENTS

| | | |
|---|---|---|
| JP | 2002289531 | 10/2002 |
| JP | 2005310851 A | 11/2005 |
| JP | 2010278167 A | 12/2010 |
| WO | WO2008064080 A1 | 5/2008 |

OTHER PUBLICATIONS

EP Exam Report for EP International Application No. 12166468.4 International Filing Date May 2, 2012; dated Sep. 27, 2012; 7 pages.
EP Exam Report for EP International Application No. 13175988.8 International Filing Date Jul. 10, 2013; dated Feb. 7, 2014; 7 pages.
EP Search Report (Extended) for EP International Application No. 15192036.0 International Filing Date Oct. 29, 2015; dated Feb. 2, 2016; 8 pages.
EP Search Report for EP International Application No. 12166465.0 International Filing Date May 2, 2012; dated Sep. 4, 2012; 3 pages.
EP Search Report for EP International Application No. 12166468.4 International Filing Date May 2, 2012; dated Sep. 4, 2012; 6 pages.
EP Search Report for EP International Application No. 13175988.8 International Filing Date Jul. 10, 2013; dated Jan. 15, 2014; 6 pages.

* cited by examiner

VAPOR DELIVERY DEVICE, METHODS OF MANUFACTURE AND METHODS OF USE THEREOF

CROSS REFERENCE TO RELATED APPLICATIONS

This application is a Divisional of U.S. patent application Ser. No. 13/552,054 filed Jul. 18, 2012, the content of which is incorporated by reference herein in its entirety.

BACKGROUND

This disclosure relates to a vapor delivery device, methods of manufacture and methods of use thereof. In particular, this disclosure relates to a high output, high capacity delivery device for delivering liquid precursor compounds in the vapor phase to reactors.

Semiconductors comprising Group III-V compounds are used in the production of many electronic and optoelectronic devices such as lasers, light emitting diodes (LEDS), photodetectors, and the like. These materials are used for manufacturing different monocrystalline layers with varying compositions and with thicknesses ranging from fractions of a micrometer to a few micrometers. Chemical vapor deposition (CVD) methods using organometallic compounds are generally employed for the deposition of metal thin-films or semiconductor thin-films, such as films of Group III-V compounds. Such organometallic compounds may be either liquid or solid.

In CVD methods, a reactive gas stream is generally delivered to a reactor to deposit the desired film for electronic and optoelectronic devices. The reactive gas stream is composed of a carrier gas, such as hydrogen, entrained with vapors of a precursor compound. When the precursor compound is a liquid (hereinafter liquid precursor compound), a reactive gas stream is generally obtained by passing (i.e., bubbling) a carrier gas through the liquid precursor compound in a delivery device (i.e., a bubbler). The delivery device comprises a bath surrounding a container that holds the liquid precursor compound.

Liquid precursor compounds have a specific enthalpy of vaporization of 2.0 to 10.0 watt-minute per gram. When there is no carrier gas flow through the delivery device the temperature difference between the bath and the liquid precursor compound is zero and no energy is expended in the delivery device. On the other hand, when it is desired to deliver the liquid precursor compound to the reactor at a particular temperature, the carrier gas is permitted to flow through the liquid precursor compound as a result of which the liquid precursor compound cools down. This cooling is undesirable because temperature variations in the liquid precursor compound lead to variable amounts of the liquid precursor compound being delivered to the reactor. The bath, in order to compensate for the temperature variations, now transfers energy to the delivery device in the form of heat in order to attempt to maintain the liquid precursor compound at a constant temperature. The temperature difference between the bath and the liquid precursor compound is therefore no longer zero. Since heat is supplied from the bath to the liquid precursor compound, the temperature of the liquid precursor compound is now not accurately known (i.e., there are temperature variations in the liquid precursor compound).

Early liquid precursor compound delivery devices were long, narrow cylinders, i.e. aspect ratio of greater than 2, which were capable of holding a volume equivalent to 200 grams of a particular liquid precursor compound. The delivery device therefore had a large surface area to liquid precursor compound mass ratio and could easily be fully immersed in commercially available constant-temperature baths. The carrier gas flows were small and thus temperature differences between the bath and the liquid precursor compound were negligible. The liquid precursor compound flux in moles per minute was known within 1 weight percent (wt %) with little change throughout the use of the bubbler.

Current liquid precursor compound delivery devices are larger than the early liquid precursor compound delivery devices and use lower-aspect-ratio cylinders (that have height-to-diameter aspect ratios of less than 2) as compared with the earlier devices. Current delivery devices contain more than 2 kilograms of liquid precursor compound, and may contain up to 10 kilograms of liquid precursor compound. These large cylinders do not normally fit into commercially available constant-temperature baths. Portions of the cylinder top often are exposed to the ambient air and thus become an unintentional source of heat or cooling to the liquid precursor compound depending upon ambient conditions.

In addition, carrier gas flows of around 1 standard liter per minute and vaporization rates of 1 gram per minute of liquid precursor compound are used in these larger current liquid precursor compound delivery devices, thus using 5 watts of energy for the vaporization. As a result, the liquid precursor compound temperature easily deviates more than 2° C. from the bath temperature, which can result in a deviation in the liquid precursor compound flux of up to 10 wt %.

Another concern with the larger current liquid precursor compound delivery devices is the time it takes to reach a steady state of precursor compound flux. The chemical process in the reactor cannot proceed until the flux of liquid precursor compound vapors from the delivery device is stabilized. The time to stabilize the liquid precursor compound flux depends mainly on heat transfer area and the mass of the liquid precursor compound in the delivery device. Both of these parameters are only approximately known. Upon starting the carrier gas flow, the liquid precursor compound uses its internal heat for evaporation, thus resulting in a cooling down of the liquid precursor compound. A relatively large liquid precursor compound mass results in a relatively longer time period to reach a steady state temperature, whereas a relatively smaller liquid precursor mass results in a relatively shorter time period to reach a steady state temperature. The time it takes to reach a steady state temperature depends on the heat transfer area and on the remaining mass.

There therefore remains a need for improved delivery devices and methods for delivering vapors of a liquid precursor compound from a large delivery device, where at least 1 watts of energy is utilized for the vaporization. It is also desirable to have a delivery device that can deliver a uniform and high flux of the precursor vapor throughout the process up to depletion of the liquid precursor compound from the delivery device, while using carrier gas flows that are greater than 1 standard liter per minute.

A delivery system for a liquid precursor compound comprises a delivery device having an inlet port and an outlet port; a first proportional valve; wherein the delivery device is in operative communication with a first proportional valve; wherein the first proportional valve is operative to control the flow of the carrier gas based on an applied voltage; a physical-chemical sensor; the physical-chemical sensor being disposed downstream of the delivery device and being operative to analyze chemical contents of a fluid stream emanating from the delivery device; the physical-chemical sensor being in communication with the first proportional valve; and a first pressure/flow controller being in operative communication with the physical-chemical sensor and with the first proportional valve; wherein the delivery system is operative to deliver a substantially constant number of moles per unit of time of a liquid precursor compound vapor to each of a plurality of reactors that are in communication with the delivery system; where the liquid precursor compound is in a liquid state in the delivery device.

A method comprises transporting a first stream of a carrier gas to a delivery device; the delivery device containing a liquid precursor compound; the first stream of carrier gas being at a temperature greater than or equal to 20° C.; transporting a second stream of the carrier gas to a point downstream of the delivery device; wherein a flow direction of the first stream and a flow direction of the second stream are not opposed to each other; and combining the first stream after it emanates from the delivery device and the second stream to form a third stream; where a dew point of a vapor of the precursor compound in the third stream is lower than an ambient temperature.

DETAILED DESCRIPTION

Figure 1:
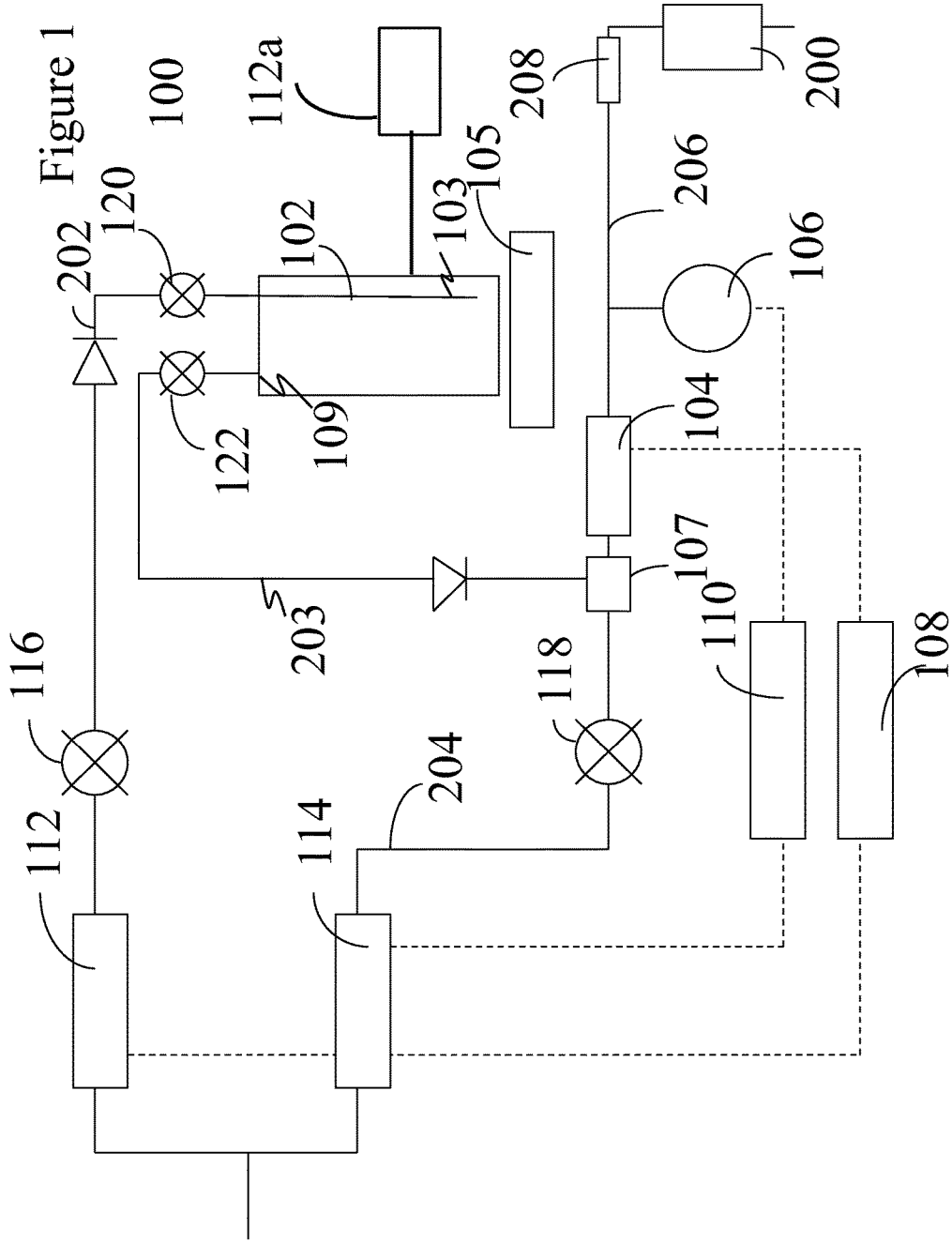
FIG. 1 is a schematic depiction of an exemplary delivery system where a delivery device is in fluid communication with one or more mass flow controllers which are each in fluid communication with a reactor vessel and where vapors from the delivery device are disposed on selected surfaces in the reactor.

The invention now will be described more fully hereinafter with reference to the accompanying drawings, in which various embodiments are shown. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The transition term "comprising" encompasses the transition terms "consisting of" and "consisting essentially of". The term and/or is used herein to mean both "and" as well as "or". For example, "A and/or B" is construed to mean A, B or A and B.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Various numerical ranges are disclosed herein. These ranges are inclusive of the endpoints as well as numerical values between these endpoints. The numbers in these ranges are interchangeable.

Disclosed herein is a delivery system for a liquid precursor that comprises a delivery device in fluid communication with a reactor (comprising a mass flow controller and a reactor vessel) via a concentration sensor and a pressure sensor. The concentration sensor and the pressure sensor are in electrical communication with a first and a second pressure/flow controller respectively that control the flow of carrier gas through the delivery system. The delivery system uses a carrier gas stream that is split into two carrier gas streams, a first stream that flows into the delivery device and contacts a liquid precursor compound and a second stream that bypasses the delivery device. A liquid precursor is an element or compound that that is in a liquid state from −10° C. to 200° C. at atmospheric pressure.

The splitting of the carrier gas into two streams eliminates the need to maintain tight control of the temperature of the precursor, such as maintaining it within a fraction of a degree Celsius. Maintaining such a tight control of the temperature at evaporative loads exceeding 1.0 Watt is both difficult and expensive. The flow path of the entire first stream may be heated to an elevated temperature, if desired to counter any heat loss and maintain the temperature closer to the original (expected) value.

The lower flow rate in the first stream when used in conjunction with the elevated temperature permits the entrainment of a higher volume of the precursor vapor. The amount of the precursor vapor transmitted per unit of time across a plane perpendicular to the direction of flow is termed the flux and is measured in moles per minute or in another convenient unit. The process performed in the reactor depends on the precursor flux. If the precursor flux cannot be precisely maintained, the process results are unpredictable. The precursor vapor flux is higher in the first stream and zero in the second gas stream in contrast to a comparative system where there is no stream that bypasses the liquid precursor compound.

The delivery system functions to deliver a uniform and constant concentration of the precursor vapors to the plurality of reactors. In conjunction with mass flow controllers that are disposed upstream of the reactor, the number of moles of precursor vapor per unit time (i.e., the flux) delivered to the reactor are also kept constant.

The first stream with a high concentration of entrained vapors and the second stream that comprises only the carrier gas contact each other downstream of the delivery device to form a third stream. The second stream and the first stream combine to form the third stream. The combination of the first stream (entrained with vapor) and the second stream (devoid of vapor) to form the third stream results in the delivery of a more precise concentration of the precursor vapor to the reactor especially when compared with a comparative device that does not use a bypass.

The dew point of the third stream can be adjusted to be below the temperature of the tubing and hardware that connects the delivery system and the reactor. In this way, condensation of the liquid precursor inside the connecting tubing is avoided. It is possible to use a variety of different liquid precursors having different dew points and avoid condensation of any of these precursors by heating any connecting lines.

The present delivery system is advantageous in that it delivers a uniform and precise concentration of precursor vapor to the reactor up to the depletion of the liquid precursor compound from the delivery device. It permits precursor fluxes that are greater than or equal to 0.5 grams per minute, preferably greater than or equal to 2.0 grams per minute, and more preferably greater than or equal to 10.0 grams per minute to a reactor or a plurality of reactors at a pressure of greater than or equal to 120 kilopascals (kPa) (900 torr), preferably greater than or equal to 160 kPa (1200 torr), and more specifically greater than or equal to 200 kPa (1500 torr).

The delivery system is also advantageous because it can provide the precursor vapors to be delivered to a plurality of reactors simultaneously. The delivery system balances competing demands from a plurality of reactors and can supply a stream having a uniform concentration of precursor vapors to each reactor irrespective of the volumetric demand from individual reactors. The present delivery system can deliver a substantially constant concentration of the precursor vapors to each of the reactors.

The concentration of the precursor vapor in the present delivery system fluctuates in an amount of less than or equal to 1 weight percent (wt %) from a selected value, preferably in an amount of less than or equal to 0.5 wt % from a selected value, and more preferably in an amount of less than or equal to 0.2 wt % from a selected value. In conventional delivery systems, the concentration of precursor vapor fluctuates by more than 10 wt %.

The delivery system is unique in that it does not utilize any opposing flows without the presence of an optional mixing chamber. In other words, the delivery system does not use flows that contact each other from opposing directions. The system may employ an opposing flow only when an optional mixing chamber is used.

As noted above, the delivery system uses a mixing chamber. In one embodiment, the mixing chamber can be used when the delivery system does not use opposing flows. Interactions between the carrier gas and the precursor vapor in the mixing chamber facilitate better mixing thus ensuring a uniform delivery of the precursor vapor to the reactors. In another embodiment, the mixing chamber is used only when the delivery system employs opposing flows.

With reference now to the FIG. 1, a delivery system 100 comprises a delivery device 102 in communication with a mass flow controller 208 and a reactor 200 via a physical-chemical sensor 104 and a pressure sensor 106 respectively. The physical-chemical sensor 104 and the pressure sensor 106 are in operative communication with a first pressure/flow controller 108 and a second pressure/flow controller 110, respectively. The first pressure/flow controller 108 is in operative communication with a first proportional valve 112, while the second pressure/flow controller 110 is in operative communication with a second proportional valve 114 respectively. In an exemplary embodiment, the first pressure/flow controller 108 is in electrical communication with a first proportional valve 112, while the second pressure/flow controller 110 is in electrical communication with a second proportional valve 114 respectively.

The delivery device 102 is not disposed in a water bath that may be used to vary or stabilize the temperature of the delivery device. It is devoid of any external sources of heating or cooling other than to be influenced by its ambient surroundings. The delivery device 102 is 0.5 liters to 100.0 liters in size and is disposed upon a scale 105. The scale 105 is used to determine the amount of liquid precursor compound contained in the delivery device 102. It will be appreciated by those skilled in the art that delivery device 102 may be many times larger, such as up to 1,000 liters, but the transport and handling of such a large delivery device would be complicated.

The proportional valves 112 and 114 operate to control the flow of the carrier gases through the delivery system 100 when they are disposed upstream of the delivery device 102. In another embodiment, a proportional valve 112a can also be disposed downstream of the delivery device if desired and operates to control the flow of the carrier gas and the precursor vapor. Shutoff valves 116, 118, 120 and 122 are used to isolate the different components of the delivery device. In one embodiment, the shutoff valves 116 and 118 are open in normal operation.

When the voltage across the proportional valves 112 and 114 is increased, the valve opening is increased thereby increasing the flow of the carrier gas through the valve. On the other hand, when the voltage across the proportional valves is decreased, the valve opening is decreased thereby decreasing the flow of the carrier gas through the valve.

In one embodiment, the physical-chemical sensor 104 along with the first pressure/flow controller 108, the first proportional valve 112, and the delivery device 102 form a first closed loop that encompasses the first stream 202 of carrier gas. The first stream 202 of carrier gas is directed to a dip tube 103 via an inlet port on the delivery device 102. The first stream is also referred to as the "source flow" stream since it contacts the liquid precursor compound in the delivery device 102 and entrains precursor vapor. Since one of the functions of the first stream is to entrain precursor vapor, it is generally maintained at an elevated temperature.

The first stream is generally maintained at an ambient temperature of 0° C. to 80° C., preferably 10° C. to 50° C., and more preferably 15° C. to 35° C. The first stream 202 entrains vapors of the precursor compound. An outlet port located atop the delivery device 102 facilitates the discharge of a stream 203 of the carrier gas with entrained vapors of the liquid precursor compound. Stream 203 emanates the delivery device 102 and contacts the second stream 204 of carrier gas in a mixing chamber 107.

In another embodiment, the pressure sensor 106 along with the second pressure/flow controller 110, the second proportional valve 114, and the mixing chamber 107 form a second closed loop that encompasses a second stream 204 of carrier gas. The second stream 204 of carrier gas is directed to the mixing chamber 107 where it contacts the stream 203 emanating from the outlet port of the delivery device 102. The second stream is also referred to as the "bypass flow" stream since it bypasses the liquid precursor compound in the delivery device 102.

The first stream 202 after exiting the delivery device 102 as stream 203 combines with the second stream 204 in the mixing chamber 107 to form a third stream 206 that enters the reactor 200 via the mass flow controller 208. The first stream 202, now stream 203, combines with the second stream 204 downstream of the outlet valve 122 to form the third stream 206, which is directed to the reactor 200. The third stream 206 contains the desired concentration of the precursor vapor in the carrier gas. As noted above, the stream 203 and the second stream 204 do not oppose each other. In one embodiment, the stream 203 and the second stream 204 flow in the same direction. In another embodiment, the stream 203 and the second stream 204 meet each other at an angle of 1 to 90 degrees to form the third stream 206 that enters the reactor 200.

In one embodiment, an optional mixing chamber 107 may be used to combine the flows from the first stream 202, now stream 203 (which contains the carrier gas and the precursor vapor from the delivery device 102) and the second stream 204. In the mixing chamber 107, the flows from the stream 203 and the second stream 204 may be introduced in opposing directions. In another embodiment, the mixing chamber 107 may be used to combine the flow from the stream 203 and the second stream 204 when these respective streams are not flowing in opposing directions. Both of these embodiments will be discussed in greater detail later.

By combining the stream 203 with the second stream 204 to form the third stream 206, the concentration of the precursor vapor in the carrier gas is reduced resulting in a lower dew point of the precursor vapor. As a result, precursor vapor condensation does not occur when the vapor entrained carrier gas encounters a reduced temperature. This permits a constant ratio of precursor vapor to the carrier gas to be supplied to a reactor or a plurality of reactors. In another embodiment, by reducing the dew point of the precursor vapor in the third stream to below the ambient temperature, precursor vapor condensation does not occur and a constant ratio of precursor vapor to the carrier gas may be supplied to a reactor.

The first and the second closed loops interact collaboratively with one another to control the delivery pressure and the precursor vapor concentration to one or a plurality of reactors 200. The flow rate of precursor into each reactor is controlled by the mass flow controller 208 associated with each reactor. The first and the second closed loops also interact collaboratively with one another to maintain the dew point of the precursor vapor precisely adjusted below the ambient temperature. This prevents condensation of the precursor vapors and permits the transportation of a larger amount of precursor vapor at a higher precision to the reactor than other comparative commercially available systems. While the respective loops have been shown to be closed loops in the FIG. 1, it is envisioned that some of these loops can also be open loops if desired.

With reference again to FIG. 1, the delivery device 102 has an inlet valve 120 that can be used to start or stop the flow of the carrier gas into the delivery device 102. The delivery device 102 also has an outlet valve 122 that can start and stop the flow of the carrier gas with entrained precursor vapor from the delivery device 102 to the reactor 200. As may be seen in the FIG. 1, the delivery device 102 is in fluid communication with the reactor 200, such that precursor vapor from the delivery device 102 is disposed on selected surfaces in the reactor 200. A mass flow controller 208 admits the desired flow of the mixture to the reactor 200.

The mass flow controller 208 may comprise a single mass flow controller or a plurality of mass flow controllers, while the reactor 200 may comprise a single reactor or a plurality of reactors (not shown). In an exemplary embodiment, the mass flow controller 208 and the reactor 200 comprises a plurality of mass flow controllers and reactors.

The delivery device 102 contains a dip tube 103 through which the carrier gas enters and an exit port 109 through which the carrier gas entrained with precursor vapor is discharged to the reactor 200. The inlet port of the delivery device 102 is in fluid communication with the inlet valve 120 while the exit port of the delivery device 102 is in fluid communication with the outlet valve 122. In one embodiment, pipes or tubes that are used to transport the carrier gas to the delivery device are all maintained at a temperature of 20° C. to 80° C.

The delivery device 102 and the inlet and outlet ports may be manufactured from a material that is not deteriorated by the carrier gas or the liquid precursor compound and that in turn does not change the composition of the carrier gas or the liquid precursor compound. It is also desirable for the material to withstand the temperatures and pressures of operation. The enclosure may be manufactured from a suitable material, such as, for example, glass, polytetrafluoroethylene and/or a metal. In one embodiment, the enclosure is constructed of a metal. Exemplary metals include nickel alloys and stainless steels. Suitable stainless steels include SS304, SS304L, SS316, SS 316L, SS321, SS347 and SS430. Exemplary nickel alloys include INCONEL, MONEL, and HASTELLOY.

The delivery device 102 generally contains an opening (not shown) through which the liquid precursor compound is introduced. The liquid precursor compound may be added to the delivery device by any suitable means.

The liquid precursor compound is the source of the precursor vapor. Any liquid precursor compound suitable for use in vapor delivery systems may be used in the delivery device including solutions and suspensions of normally solid compounds. Suitable precursor compounds include indium compounds, zinc compounds, magnesium compounds, aluminum compounds, gallium compounds, and combinations comprising at least one of the foregoing compounds or liquid solutions and suspensions of such compounds. Preferably, the liquid precursor compounds are chosen from aluminum compounds, gallium compounds, and combinations comprising at least one of the foregoing compounds. Mixtures of liquid precursor compounds may be used in the present delivery devices.

Preferred liquid precursor compounds include boron tribromide, phosphorous oxychloride, phosphorous tribromide, silicon tetrachloride, silicon tetrabromide, tetraethyl orthosilicate, arsenic trichloride, arsenic tribromide, antimony pentachloride, trimethylgallium (TMGa), triethylgallium (TEGa), trimethylaluminum (TMAl), ethyldimethylindium, tertiary-butylarsine, tertiary-butylphosphine, germanium tetrachloride ($GeCl_4$), stannic chloride ($SnCl_4$), trimethylarsenic $(CH_3)_3As$, trimethylgallium $(CH_3)_3Ga$, triethylgallium $(C_2H_5)_3Ga$, isobutylgermane $(C_4H_9)GeH_3$, diethyltelluride $(C_2H_5)_2Te$, diisopropyltelluride $(C_3H_7)_2Te$, dimethylzinc $(CH_3)_2Zn$, diethylzinc $(C_2H_5)_2Zn$, trimethylantimony $(CH_3)_3Sb$, triethylantimony $(C_2H_5)_3Sb$, boron trichloride ($BCl_3$), chlorine trifluoride ($ClF_3$), trisilane ($Si_3H_8$), or the like, or a combination comprising at least one of the foregoing precursors.

More preferred liquid precursor compounds are trimethylgallium, riethylgallium, trimethylaluminum, tertiary butylphosphine, tertiary butylarsine, tetraethyl orthosilicate, silicon tetrachloride, germanium tetrachloride, isobutyl germane, trimethyl antimony, dimethyl zinc, diethyl zinc, or the like, or a combination comprising at least one of the foregoing liquid precursor compounds.

A suitable carrier gas may be used with the delivery device 102 as long as it does not react with the liquid precursor compound. The particular choice of carrier gas depends upon a variety of factors such as the precursor compound used and the particular chemical vapor deposition system employed. Suitable carrier gases include inert gases. Exemplary gases are hydrogen, nitrogen, argon, helium, and the like.

The physical-chemical sensor 104 is a concentration sensor and measures the concentration of the precursor vapor in the carrier gas. The physical-chemical sensor 104 controls the mass transfer rate of the precursor vapor into the reactor by continually monitoring gas concentration and controlling the first stream 202 through the delivery device 102 to account for concentration changes and/or drift.

In one embodiment, the physical-chemical sensor 104 is an in-line acoustic binary gas concentration sensor used for sensing the ratio of the precursor vapor to the carrier gas. The physical-chemical sensor generates an acoustic signal that travels through the gas mixture (i.e., the mixture of the vapor of the precursor compound and the carrier gas), using a digital signal processing technique to precisely measure the time of travel of the acoustic signal. The time of travel is then used to calculate the concentration of the precursor vapor in the carrier gases based upon their physical properties. This concentration measurement provides data that allows for control of the mass transfer rate of the precursor vapor while compensating for any variations in the concentration of the precursor vapor with respect to the carrier gas. This control in the mass transfer rate is brought about by the first proportional valve 112. Other sensors include microelectronic mechanical circuits (MEMCs) that also measure the composition of a binary gas by measuring the density.

For example, when the output from the physical-chemical sensor 104 is zero volts it indicates that the concentration of the precursor vapor in the carrier gas is 0 wt % (weight percent). When the output from the physical-chemical sensor 104 is 5 volts, the concentration of the precursor vapor in the carrier gas is 1 wt %. In an exemplary embodiment, the physical-chemical sensor 104 is a PIEZOCON®, commercially available from Veeco Corporation.

In an exemplary embodiment, when the liquid precursor compound is trimethylgallium, the physical-chemical sensor 104 is used to control the flow through the delivery device 102 to provide the delivery system 100 with a 15° C. dew point for the trimethylgallium vapor. The transport plumbing (i.e., lines that transport the carrier gas and the precursor vapor) between the delivery device 102 and the mass flow controller 208 feeding the reactor 200 are generally maintained at room temperature of 20° C. in order to avoid the cost of maintaining the transport plumbing at temperatures greater than 20° C. In order to keep the trimethylgallium vapors from condensing in the transport plumbing a dew point of 15° C. is selected for the trimethylgallium. This 5° C. difference permits a continuous steady flow of the precursor vapor to the reactor.

The pressure sensor 106 measures the pressure across the delivery device 102. The pressure sensor 106 may be a pressure gauge, a manometer, or the like. The pressure sensor 106, in combination with the second controller 110, and the second proportional valve 114, provides a mechanism to control the pressure of the precursor vapor and the carrier gas.

Figure 4:
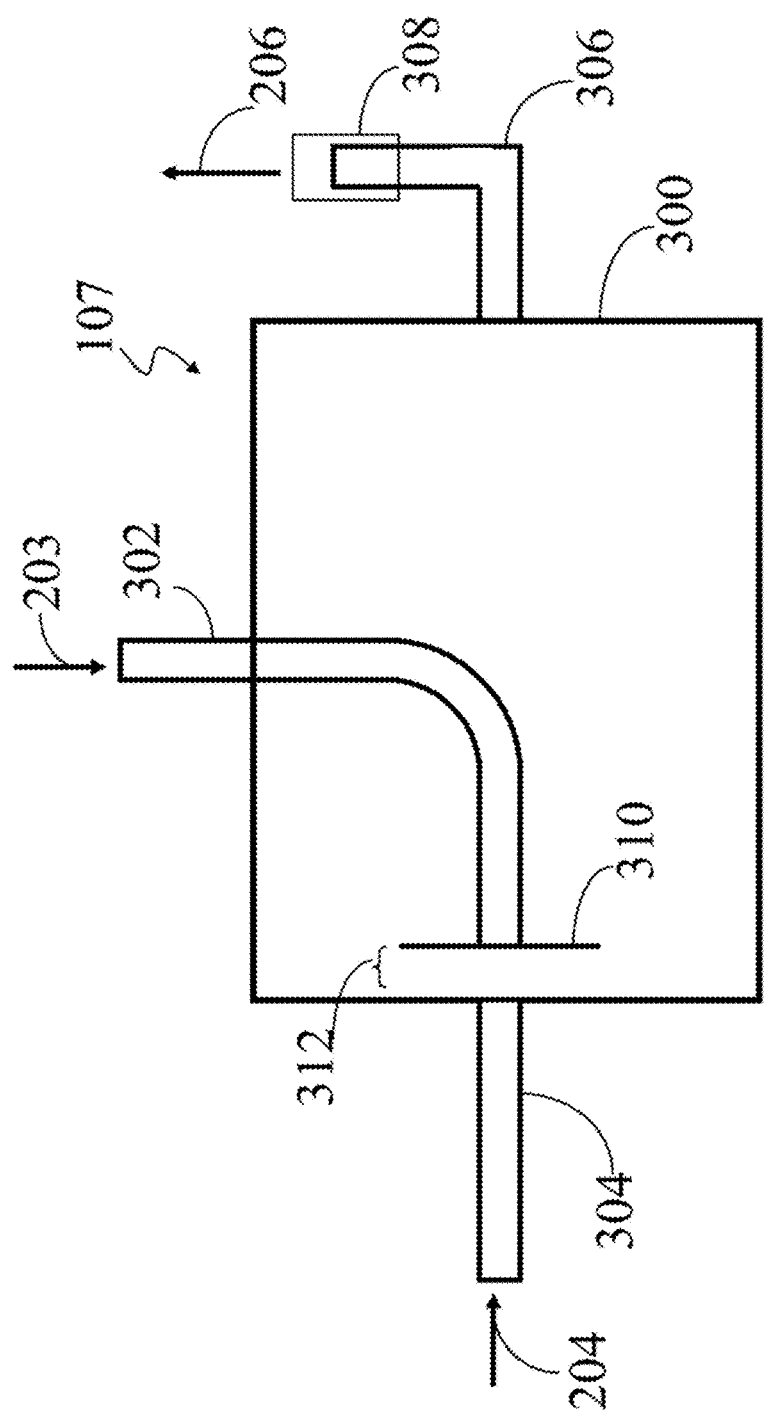
FIG. 4 is a schematic depiction of an exemplary mixing chamber.
Figure 5:
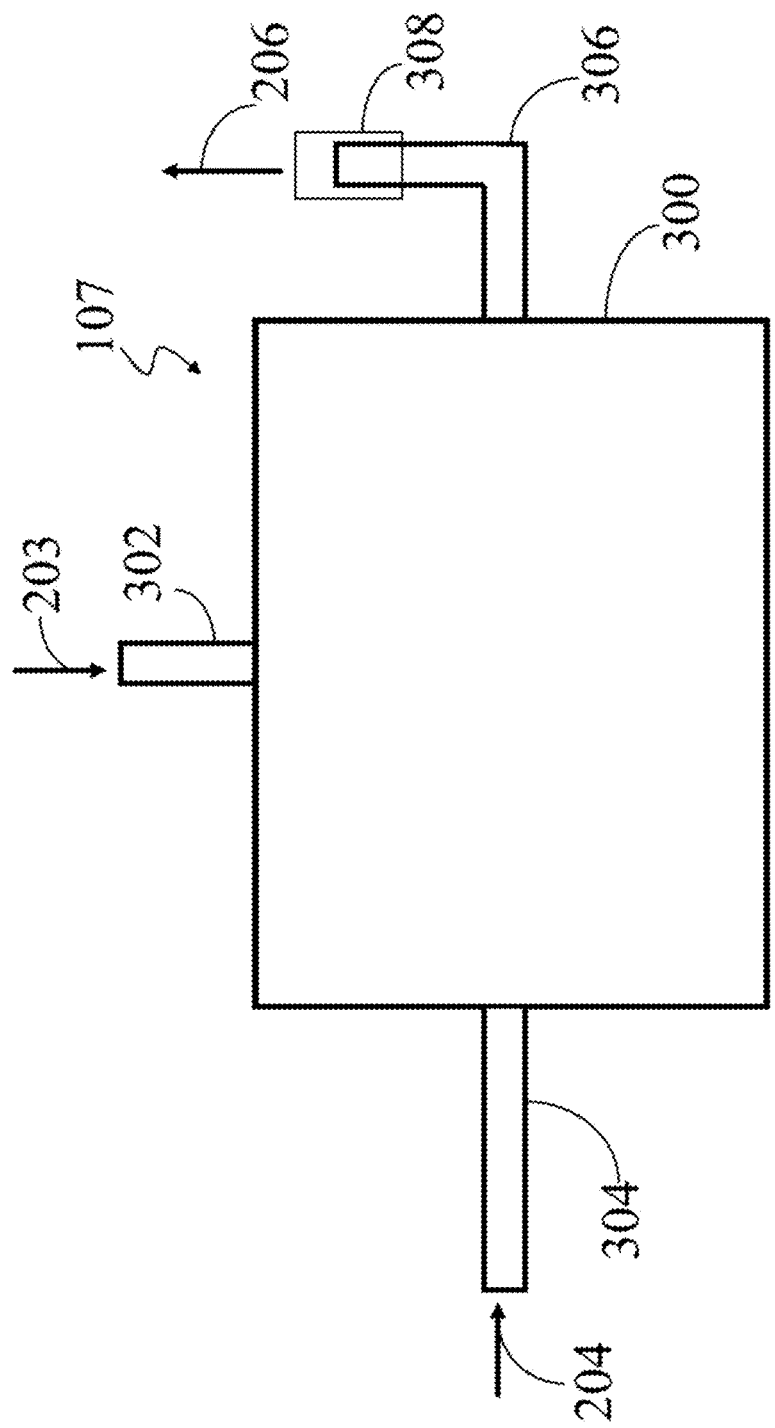
FIG. 5 is a schematic depiction of another exemplary mixing chamber.

The optional mixing chamber 107 is detailed in the FIGS. 4 and 5. FIG. 4 shows the mixing chamber 107 when it contains opposing flows, while FIG. 5 shows the mixing chambers 107 when it does not contain an opposing flow.

FIG. 4 depicts the mixing chamber 107 having opposing flows for the stream 203 and the second stream 204. The mixing chamber 107 comprises a chamber 300 that is manufactured from a nickel alloy or a stainless steel. The chamber 300 may have any shape but is preferably a cylinder with diameter and height being equal or nearly equal. In one embodiment, it is desirable to have a diameter of the mixing chamber be greater than or equal to 1 inch (2.5 cm), preferably greater than or equal to 2 inches (5 cm) and more preferably greater than or equal to 3 inches (7.5 cm). In another embodiment, the height of the cylinder is greater than or equal to 2 inches (5 cm), preferably greater than or equal to 3 inches (7.5 cm) and more preferably greater than or equal to 4 inches (10 cm).

The stream 203 enters the chamber 300 via a conduit 302 while the second stream 204 enters the chamber 300 via a conduit 304. The third stream 206 leaves the chamber 300 via a conduit 306. The position of the mixing chamber 107, when it is used in the delivery system, allows it to be a part of the first closed loop and the second closed loop.

The respective conduits preferably have a circular cross-section with a outer diameter that is greater than or equal to 3 millimeters (mm) (0.125 inches), preferably greater than or equal to 6 mm (0.25 inches) and more preferably greater than or equal to 12 mm (0.5 inches). As may be seen in the FIG. 4, the outlets of the conduit 302 and 304 are opposed to each other. The outlets of conduits are designed to be opposed to each other and to be less than 12 mm apart from each other so that the stream 203 and the second stream 204 can be intimately mixed with each other prior to exiting the chamber via the conduit 306 as the third stream 206. The conduit 306 is provided with a device 308 for connecting the chamber 300 to a conduit that is in communication with an inlet (not shown) to the reactor 200.

The conduit 302 is fitted with a baffle 310 that is parallel a side of the chamber 300 that communicates with the conduit 304. The baffle 310 forces the first stream 202 and the second stream into an intimate mixture with each other in the space 312 between the baffle 310 and the side of the chamber 300.

FIG. 5 depicts the mixing chamber 107 having flows for the stream 203 and the second stream 204 that are not opposed to each other. In this depiction, the stream 203 enters the chamber 300 via the conduit 302, while the second stream 204 enters the chamber 300 via the conduit 304. The meeting of the two streams in the chamber 300 brings about mixing between the two streams 203 and 204, which then depart the chamber 300 as the third stream 206 via the conduit 306. In the embodiments depicted in the FIGS. 4 and 5, the conduits 302, 304 and 306 may contain nozzles, porous filters, or other devices that are used to enhance mixing of the stream 203 with the second stream 204. The mixing chamber may also contain packing materials such as beads, rods, tubes, horseshoes, rings, saddles, discs, saucers, or other suitable forms such as aciform, cruciform, and helicoids (coils and spirals). The packing material may be composed of ceramic materials such as alumina, silica, silicon carbide, silicon nitride, borosilicates, alumina silicates, and combinations comprising at least one of the foregoing, and/or metals such as stainless steel or nickel alloys. Combinations of different packing materials listed above may be used if desired. The mixing chamber 107 may be used in any of the embodiments depicted in the following FIGS. 1-3 at the point where the stream 203 contacts the second stream 204.

With reference once again to the FIG. 1, the first controller 108 and the second controller 110 are self-contained proportional-integral-derivative (PID) control modules that are designed to provide optimized control of the total pressure or flow of the carrier gas through the delivery system 100. The input for the first proportional valve 112 is obtained from the pressure sensor 106. The input for the second proportional valve 114 is obtained from the physical-chemical sensor 104. Each pressure/flow control system comprises three basic parts, notably a process sensor, a proportional-integral-derivative controller and a control element. Controllers 108 and 110 may also be realized as software in Programmable Logic Controllers (PLC, such as the Omron CJ1W controller) in combination with appropriate driving hardware for the valves 112 and 114.

In the operation of the first proportional valve 112, the physical-chemical sensor 104 measures the process pressure or carrier gas flow rate. The proportional-integral-derivative controller compares the measured concentration of the precursor to the desired set point and adjusts the proportional valve 112 as necessary to achieve the desired precursor vapor concentration in the third stream 206.

In the operation of the second proportional valve 114, the pressure sensor 106 controls the bypass flow to maintain the programmed pressure. The precursor vapor demands of the reactor 200 are made by the mass flow controller 208. In response, the pressure sensor 106 in conjunction with the flow controller 110 and the second proportional valve 114 adjusts the flow of the carrier gas in the second stream 204 to provide the desired pressure in the third stream 206.

In one embodiment, a plurality of pressure/flow controllers can be slaved to a master pressure/flow controller, which adjusts the total flow of the carrier gases to achieve the desired pressure, while the physical-chemical sensor 104 and the associated controller 108 maintains the desired gas ratio/mixture. For example, the first proportional valve 112 and the second proportional valve 114 from the FIG. 1 can be slaved to a main pressure controller (not shown) to divide the total flow of the carrier gases to the stream 203 and the second stream 204. There would be no active control of the concentration in this embodiment.

The shutoff valves 116 and 118 and the inlet and outlet valves 120, 122 may be gate valves, ball valves, butterfly valves, needle valves, or the like. They may also be controlled by a PLC and support the maintenance of a precise precursor concentration when the demand from the reactor 200 is zero.

In one embodiment, in one manner of utilizing the delivery system 100 of the FIG. 1, the reactor 200 draws vapor from the delivery device 102. The carrier gas can be delivered by either the first proportional valve 112 or the second proportional valve 114 or both depending upon the information provided by the physical-chemical sensor 104 and the pressure sensor 106.

In one embodiment, the carrier gas is optionally heated to a temperature not greater than the boiling point of the liquid precursor compound as it travels through the fluid lines (e.g., pipes or tubes) that include the first stream 202 and the second stream 204. The carrier gas in the first stream 202 travels through the delivery device 102 and entrains the vapors of the precursor compound. The carrier gas with the vapor entrained therein (stream 203) then meets with the carrier gas in the second stream 204. By adjusting the mass flow of the carrier gas in the first stream 202 and the second stream 204, the concentration of the precursor vapor can be maintained at a desired amount.

The "desired amount" is determined by settings of the physical-chemical sensor 104 and the pressure sensor 106 and the respective pressure/flow controllers 108 and 110. The concentration of the precursor vapor in the third stream 206 is measured by the physical-chemical sensor 104. The pressure and/or the flow rate of the carrier gas (with precursor vapor entrained therein) are measured by the pressure sensor 106.

When the concentration of the precursor vapor relative to the carrier gas deviates from a desired amount or a desired range, the physical-chemical sensor 104 communicates with the controller 108 and with the proportional valve 112 to adjust the flow of the carrier gas to the delivery device 102. By adjusting proportional valve 112, the amount of the precursor vapor in the carrier gas in the stream 206 can be adjusted to be substantially constant. The flow rate of the carrier gas with the entrained precursor vapor in the third stream 206 depends on the demand of the mass flow controller 208 and is controlled by the second controller 110 and the second proportional valve 114.

For example, when the concentration of precursor vapor drops relative to the carrier gas in the third stream 206, an electrical communication from the physical-chemical sensor 104 to the controller 108 and the first proportional valve 112 increases the flow of the carrier gas to the delivery device 102 via the first stream 202 that includes the valve 116 and the inlet valve 120. Concurrently the bypass flow 204 is reduced by the same amount. This increases the amount of the precursor vapor in the carrier gas in the third (combined) stream 206. The increase in the amount of the precursor vapor in the stream 203 when combined with the reduced mass flow rate in the second stream 204 produces a third stream 206 that has a concentration of precursor vapor that is substantially constant when compared with the amount of precursor vapor prior to the decrease that brought about the adjustment in the flow rate of the first stream 202.

In another embodiment, when the concentration of precursor vapor increases in the third stream 206, an electrical communication from the physical-chemical sensor 104 to the controller 108 and the proportional valve 112 decreases the carrier gas flow though the delivery device 102 via the first stream 202. This leads to an increase of the carrier gas flow in the second stream 204. The increase in the carrier gas flow in the second stream 204 when combined with the decreased carrier gas flow in the first stream 202 produces a third stream 206 that has a concentration of precursor vapor that is substantially constant when compared with the amount of precursor vapor prior to the decrease that brought about the adjustment in the flow rate of the second stream 204.

The readings from the physical-chemical sensor 104 and the pressure sensor 106 are thus used to adjust or to maintain a narrowly controlled precursor vapor concentration and the flow rate of the precursor vapor to the reactor 200.

As noted above, the delivery system 100 described herein is advantageous in that it uses the first stream 202 (i.e., the source flow) and the second stream 204 (i.e., the bypass flow) to lower the dew point of the precursor vapor in the carrier gas to below the ambient temperature or more preferably the temperature of the connecting tubing and hardware carrying the third flow 206.

Figure 2:
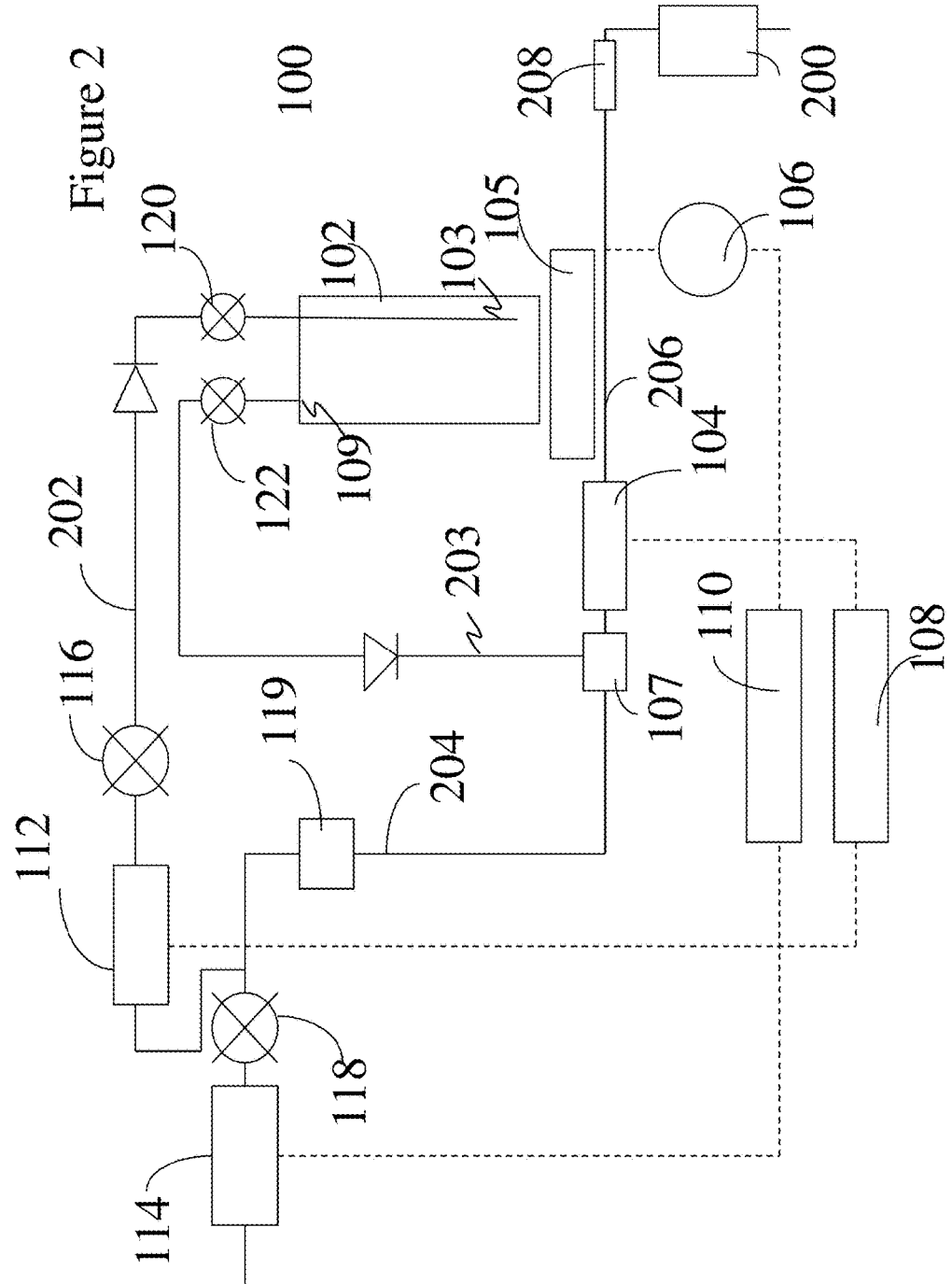
FIG. 2 is a schematic depiction of an exemplary delivery system where a single pressure/flow controller controls the flow rate through the delivery device.

FIG. 2 depicts another embodiment of the delivery system 100 where the carrier gas is split into the first stream 202 (that flows through the liquid precursor compound and emerges as stream 203) and the second stream 204 (that bypasses the liquid precursor compound) and is recombined to form the third stream 206, where the dew point is below the ambient temperature. The flow direction of the first stream 202, the flow direction of the second stream 204 and the flow direction of the third stream 206 are unidirectional and are not opposed to each other. As noted above, there are no opposing flows in the delivery system, except when a mixing chamber is used. This is because using opposing flows in the delivery system do not produce the desired mixing between the carrier gas and the precursor vapor, which results in the delivery an uneven distribution of the precursor vapor to the plurality of reactors.

The delivery system 100 in the FIG. 2 is almost similar to the delivery system of the FIG. 1 with the exception of the position of the second proportional valve 114 and a needle valve 119. In this depiction, a single proportional valve 114 driven by controller 110 in communication with the pressure sensor 106 is used to control the pressure in the entire delivery system 100. The delivery system 100 of the FIG. 2 comprises at least two closed loops for adjusting the pressure and the precursor vapor concentration in the carrier gas.

As may be seen in FIG. 2, the first proportional valve 112 lies downstream of the second proportional valve 114 and may optionally be slaved to the second proportional valve 114. A needle valve 119 lies downstream of the shutoff valve 118. The needle valve 119 facilitates an adjustable drop in pressure that can be used to adjust the flow of the carrier gas through the first proportional valve 112 and the delivery device 102.

Figure 3:
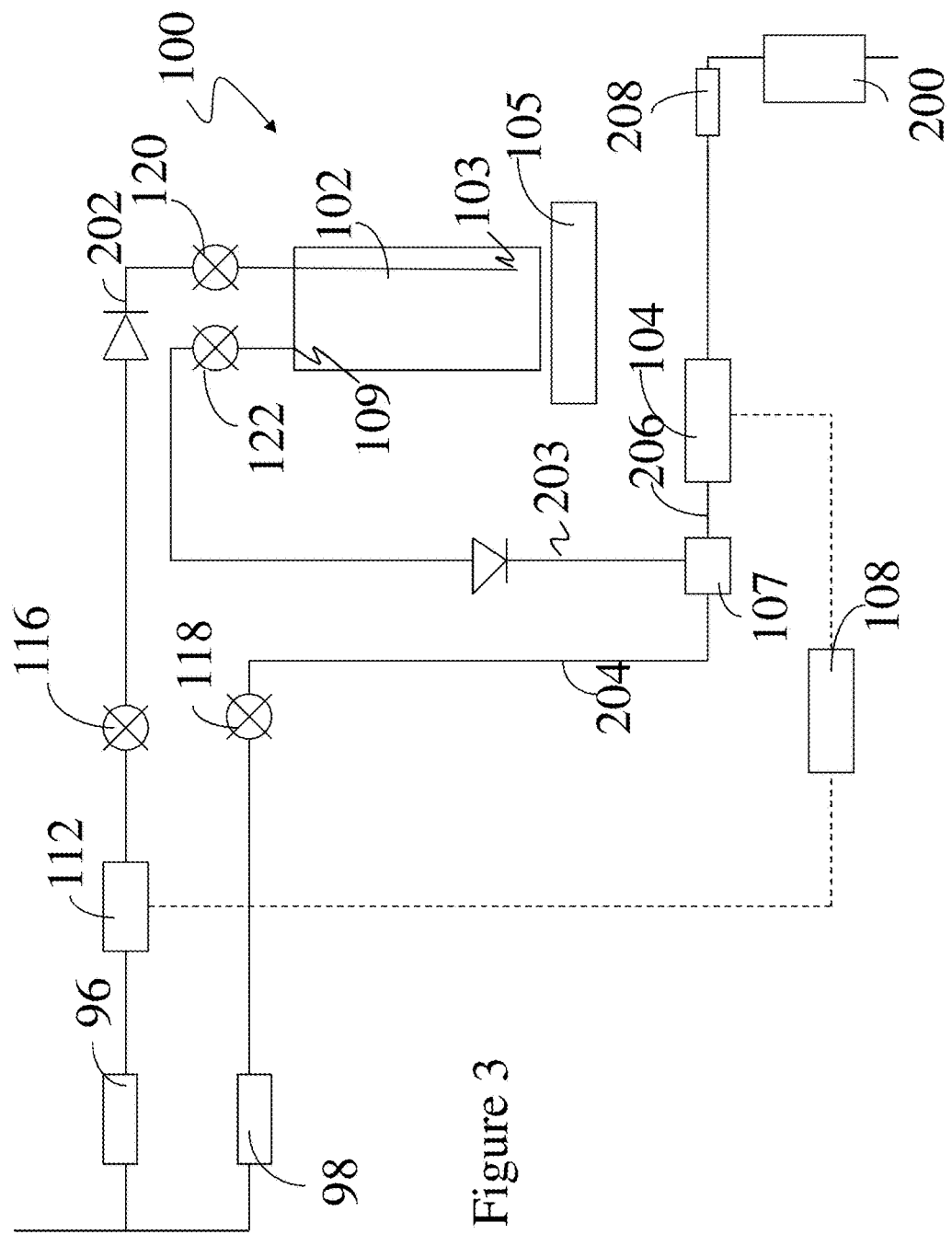
FIG. 3 is another schematic depiction of an exemplary delivery system where a single pressure/flow controller controls the mass flow rate through the delivery device.

FIG. 3 depicts yet another embodiment of the delivery system 100 that comprises a plurality of pressure regulators in communication with the delivery device 102. The pressure regulators function to promote a drop in the pressure of the incoming carrier gas to a pressure level that is used for the mass flow controller 208.

In this embodiment, the delivery system 100 comprises a first pressure regulator 96 and a second pressure regulator 98 that lies downstream of the first pressure regulator 96. The first pressure regulator 96 facilitates a drop in pressure of the incoming carrier gas from a first pressure $P_1$ to a second pressure $P_2$, while the second pressure regulator 98 facilitates a further drop in the pressure from the second pressure $P_2$ to a third pressure $P_3$. The first pressure $P_1$ is greater than or equal to the second pressure $P_2$, which is greater than or equal to the third pressure $P_3$.

In one embodiment, the second pressure $P_2$ is 50% to 90% of the first pressure $P_1$, preferably 55% to 65% of the first pressure $P_1$. In an exemplary embodiment, the second pressure $P_2$ is 70% to 85% of the first pressure $P_1$. The third pressure $P_3$ is 40% to 48% of the first pressure $P_1$, preferably 43% to 47% of the first pressure $P_1$.

The first pressure $P_1$ is 1,900 to 2,100 torr (250 to 280 kPa), preferably 1,950 torr to 2,050 torr (260 to 275 kPa). The second pressure $P_2$ is 950 torr to 1,400 torr (125 to 190 kPa), preferably 1,000 torr to 1,300 torr (130 to 175 kPa). The third pressure $P_3$ is 500 to 950 torr (65 to 125 kPa), preferably 850 torr to 925 torr (110 to 120 kPa). The delivery device 102 can thus operate in conjunction with a reactor 200 whose inlet pressure is 500 to 2,000 torr (65 to 260 kPa), preferably 700 to 1800 torr (90 to 240 kPa), and more preferably is 900 torr (120 kPa). The reactor 200 by operating in the range between 50 and 760 torr (6 to 101 kPa) thus extracts via the mass flow controller 208 from the delivery device 100 the precise precursor vapor that is used for the chemical reaction that occurs in the reactor.

Disposed downstream of the first pressure regulator 96 are the first proportional valve 112, a shutoff valve 116, the inlet valve 120, the delivery device 102, the outlet valve 122 and the physical-chemical sensor 104. The first proportional valve 112 is disposed downstream of the first pressure regulator 96 and upstream of the second pressure regulator 98.

The first pressure regulator 96 is in fluid communication with the first proportional valve 112, a shutoff valve 116, the inlet valve 120, the delivery device 102, the outlet valve 122 and the physical-chemical sensor 104. The fluid stream that includes the first pressure regulator 96, the first proportional valve 112, a shutoff valve 116, the inlet valve 120, the delivery device 102, the outlet valve 122 and the physical-chemical sensor 104 lie is termed the first stream 202. The first stream 202 directs the carrier gas to the inlet port of the delivery device 102.

The physical-chemical sensor 104 is in communication with the first proportional valve 112. In one embodiment, the physical-chemical sensor 104 is in electrical communication with the first proportional valve 112. The proportional valve 112, a shutoff valve 116, the inlet valve 120, the delivery device 102, the outlet valve 122 and the physical-chemical sensor 104 are in a closed loop.

The second pressure regulator 98 is disposed upstream of shutoff valve 118 and the mixing chamber 107. The fluid stream that includes the second regulator 98 and the second valve 118 is termed the second stream 204.

The stream 203 emanating from the delivery device contacts the second stream 204 to form the third stream 206. In one embodiment, the stream 203 contacts the second stream 204 downstream of the outlet valve 122 of the delivery device 102. The physical-chemical sensor 104 is disposed downstream of the outlet valve 122. Output signals from the physical-chemical sensor 104 are directed to the first proportional valve 112 through the first controller 108.

In one manner of operating the delivery system 100 of the FIG. 3, the reactor 200 draws a mixture of the precursor vapor and the carrier gas from the delivery device 102. The physical-chemical sensor 104 measures the precursor vapor concentration and/or the flow rate (or pressure) in the third stream 206. If the precursor vapor concentration and/or the flow rate in the third stream 206 lie outside desired limits, the sensor 104 communicates with the first proportional valve 112 through the first controller 108. The first controller 108 increases or reduces the voltage to the first proportional valve 112. By closing or opening the proportional valve 112, the flow rate (or the pressure) of the carrier gas or the concentration of the precursor vapors in the carrier gas will be adjusted to a desired value.

In one method of manufacturing the delivery system 100, the proportional valves 112 and/or 114 are disposed upstream of the delivery device 102. Shutoff valves 116 and/or 118 are disposed downstream of the proportional valves 112 and/or 114 respectively and upstream of the delivery device 102. The delivery device 102 is disposed in a heated enclosure 103. The inlet valve 120 and the outlet valve 122 are disposed at the inlet and the outlet respectively of the delivery device 102. The physical-chemical sensor 104 and the pressure sensor 106 are disposed downstream of the delivery device 102 and form closed loops with the proportional valves 112 and/or 114 respectively. The delivery system 100 is in fluid communication with the reactor 200 via a mass flow controller 208. The mass flow controller 208 is disposed upstream of the reactor 200.

The delivery system 100 is advantageous in that it can deliver a constant stream of precursor vapor at a larger flow rate than other comparative devices. The method does not involve any opposing flows. The flow throughout the delivery system 100 involves flow in a single direction. This produces better mixing between the carrier gas and the liquid precursor vapor. Systems that have opposing flows suffer from the problems that occur when one of the flows increases in pressure over the other flow. This produces a non-uniform supply of the precursor vapor to the reactors.

The system 100 also permits the delivery of a uniform and highly precise concentration of the liquid precursor compound to the reactor 200. This feature distinguishes the system 100 over other comparative delivery systems that attempt to supply a uniform concentration of the liquid precursor compound to the reactor. The delivery of a constant number of moles per unit time generally can be obtained by generating a constant number of moles per unit volume, especially when the system has opposing flows of carrier gas. Fluctuations of precursor concentration often give rise to fluctuations of the precursor per unit time that is delivered to the reactor, which leads to the production of non-conforming product.

The disclosed system 100 also permits a uniform mass flow of the precursor to the reactor over a large period of time of 10 minutes to several months. In one embodiment, the delivery system 100 can deliver the precursor vapor at rates greater than or equal to 1,500 micromoles per minute, preferably greater than or equal to 1,750 micromoles per minute and more preferably greater than or equal to 2,000 micromoles per minute at a temperature of greater than or equal to 15° C. and a pressure of greater than or equal to 900 torr (120 kPa), while maintaining carrier gas flow rates of greater than or equal to 1 standard liters per minute (slm), preferably greater than or equal to 2 standard liters per minute, and more preferably greater than or equal to 3 standard liters per minute to the reactor 200.

Figure 6:
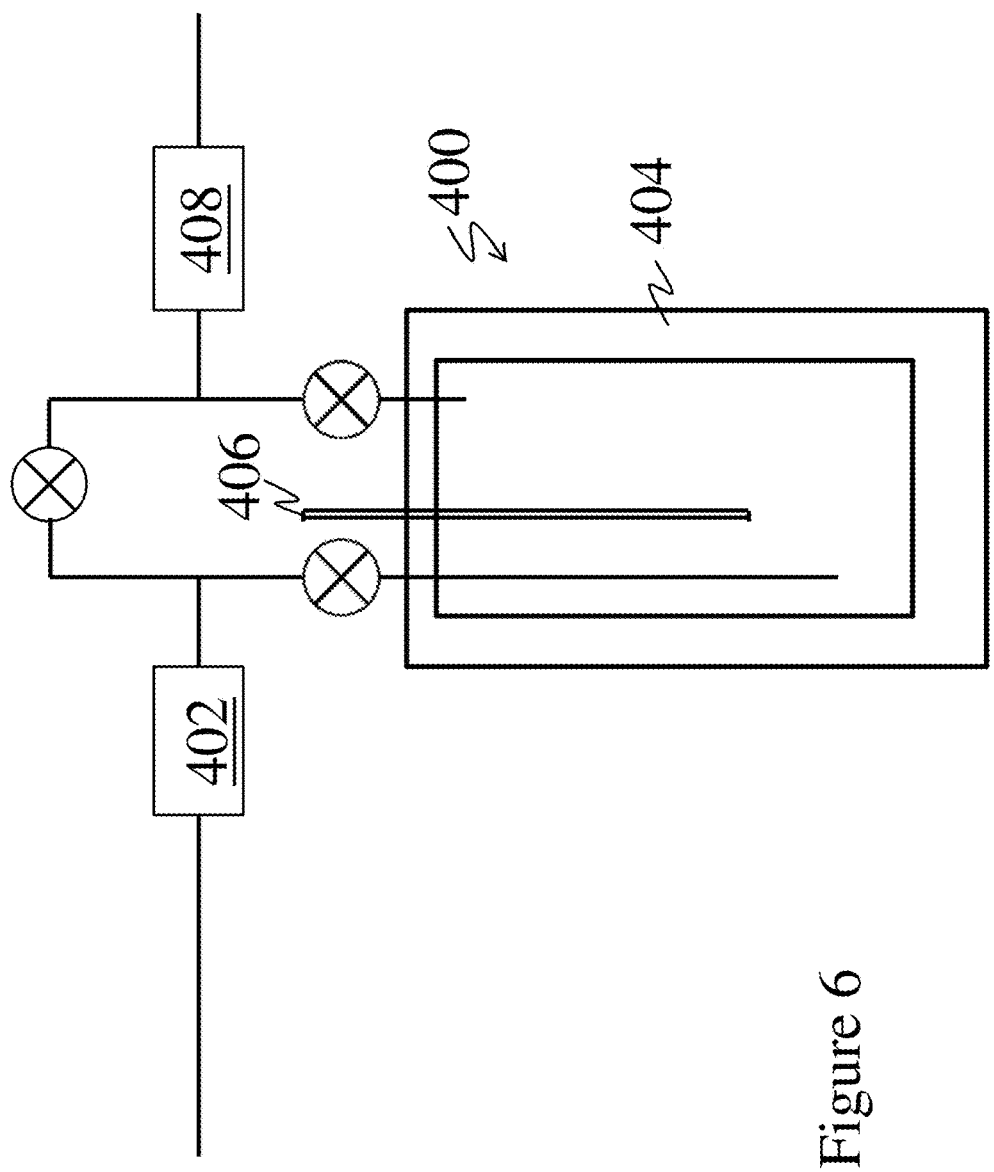
FIG. 6 is a schematic depiction of a comparative delivery device that was used in the example and was compared with the disclosed delivery devices.

The following example was conducted to demonstrate that the disclosed delivery device delivers a steady concentration of liquid precursor compound to the reactor when compared with a comparative delivery device. FIG. 6 is a depiction of a comparative prior art delivery device 400 that comprises a 1 standard liter per minute mass flow controller 402, a constant temperature bath 404, a thermometer 406 immersed directly into the liquid precursor compound and a binary gas concentration sensor 408. The carrier gas is nitrogen. Carrier gas flow, the liquid precursor compound temperature and vapor concentration were recorded every second. The liquid precursor compound was trimethylgallium.

Figure 7A:
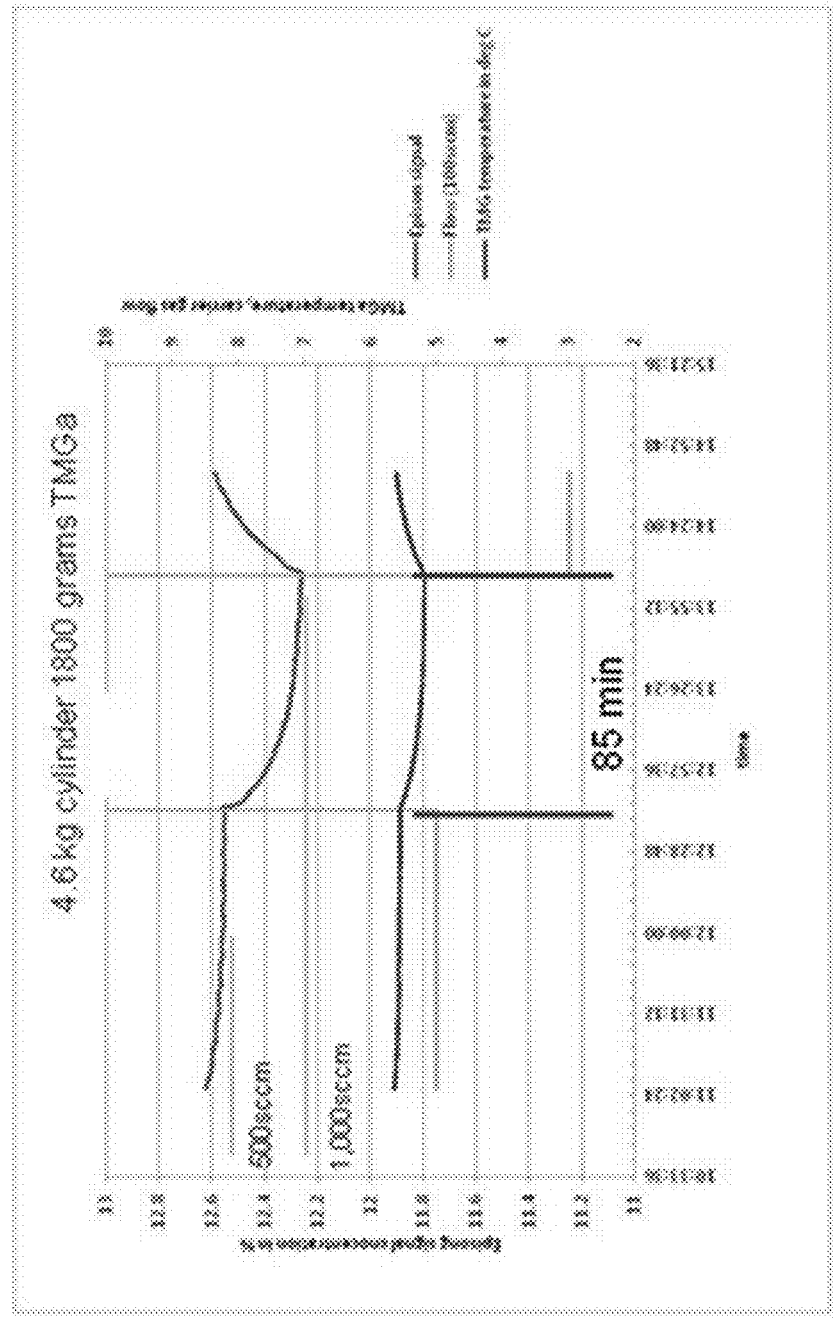
FIG. 7A is a graph showing performance of the comparative delivery device when filled to 40% of its capacity.
Figure 7B:
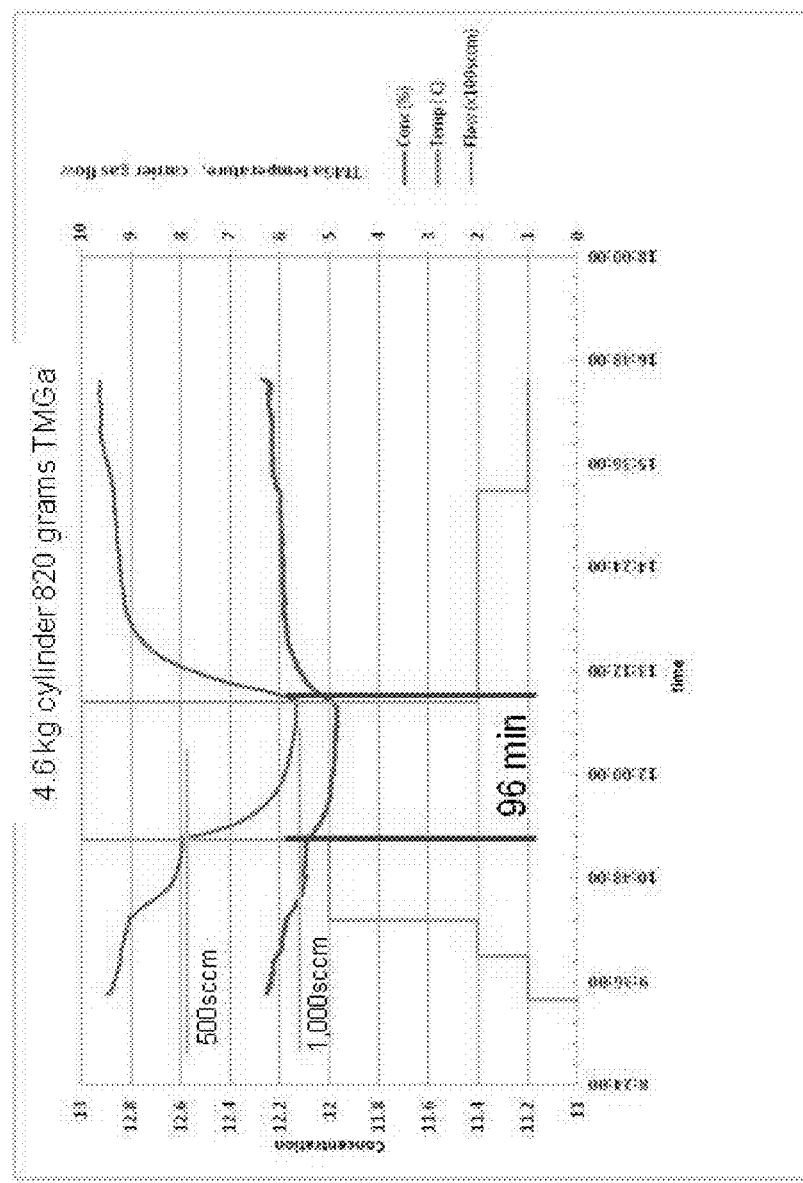
FIG. 7B is a graph showing performance of the comparative delivery device when filled to 20% of its capacity.

FIGS. 7A and 7B show the response of the liquid precursor compound temperature and the liquid precursor compound vapor concentration to step changes in the flow for a 4.6 kilogram (kg) cylinder with an aspect ratio of close to 1. These step changes are common when the source is turned on for epitaxy or when a reactor is added or dropped from the supply in cluster tools. The change in flow will change the trimethylgallium flux to the other reactors that are online. The bath temperature for the experiments was 5° C. The total pressure was 101 kPa (760 torr).

FIG. 7A shows the response of the cylinder at a fill level of 40% (1.8 kg). Although the bath temperature was 5.0° C., the temperature of the trimethylgallium was 5.7° C. at no flow. In the setup shown in the FIG. 6, the top of the cylinder was not immersed into the bath and the heat from the surrounding air heated the trimethylgallium. After switching the flow to 1 standard liter per minute (slm) it took the trimethylgallium 85 minutes or 25 grams to reach steady state before steady state was reached and the carrier gas along with the entrained vapor could be fed to the reactor to being epitaxial growth. At 1 slm the temperature difference is 0.7° C. which means that only 0.971× of the intended trimethylgallium a flux is actually reaching the substrate.

FIG. 7B shows the same cylinder at a fill level of 20% (820 grams). After switching the flow to 1 slm, the time to steady state is 95 minutes, which is no significant change from a cylinder filled to the 40% fill point. Since the heat transfer area is reduced from the previous experiment (i.e., the 40% fill level) the temperature difference has increased to 1.4° C. The trimethylgallium flux is 0.94× of the intended flux.

The incorporation of sophisticated engineering controls for every cylinder to correct for the variation in flux would add costs to the infrastructure that are prohibitively high. Therefore, the industry employs correction charts to address shifts in flux over the life of the cylinder. This means that every tool has to be individually tuned for every run.

Uncertainty in tuning lowers epitaxy yields. It should be noted that for cylinders larger than 4 kg the time to reach steady state is longer and the shifts during the life of the cylinder are more pronounced. The longer the time to reach steady-state, the higher the amount of trimethylgallium that is sent wasted (i.e., vented to outside the system) before epitaxial growth can be initiated.

From FIGS. 7A and 7B it may be seen that every time the rate of flow of the carrier gas is changed, there is a significant change in the temperature of the liquid precursor compound. This change in temperature is accompanied by a significant change in the concentration of trimethylgallium in the carrier gas. Not only is there a change in concentration of the liquid precursor compound in the vapor stream, but it takes a considerable amount of time for the change in concentration to level off at a certain concentration (steady state), that may be found with the help of charts and corrected for when running the process. This change in concentration as well as the accompanying inertia (the amount of time taken to return to the steady state) is undesirable and can be overcome by using the disclosed delivery device.

Figure 8:
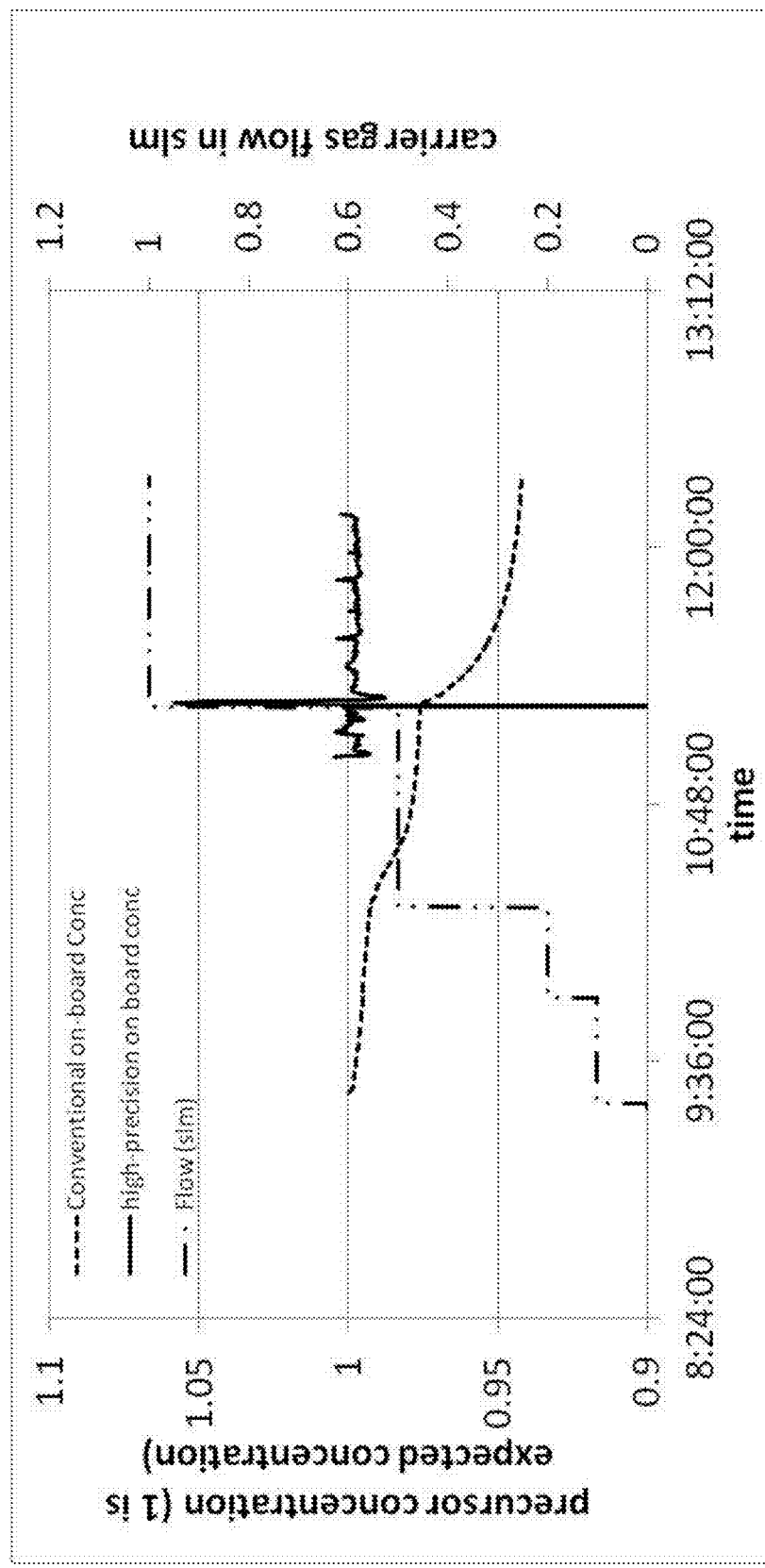
FIG. 8 is a graph that depicts performance data for the conventional delivery device as well as for the disclosed delivery device.

The delivery device detailed in this disclosure was also tested and has the same configuration as that depicted in the FIG. 3. The concentration was maintained in the carrier gas flow range from 0 to 2 slm. The total pressure was 101 kPa (760 torr). The trimethylgallium cylinder was in a chemical hood with no provision to regulate the trimethylgallium temperature. The liquid precursor compound for this example was also trimethylgallium. The knowledge of the exact temperature of the trimethylgallium is not necessary for the new delivery system to work. The results are detailed in the FIG. 8. The FIG. 8 contains data for the conventional delivery device as well as for the disclosed delivery device. From FIG. 8 it can be seen that there is a significant change in trimethylgallium concentration for the conventional device when a change in the amount of the carrier gas supplied to the delivery device takes place. However, for the disclosed delivery device of FIG. 3, the concentration immediately returns to its set concentration following a change in the amount of carrier gas supplied to the delivery device.

In summary, the concentration of the liquid precursor compound vapors per unit volume fluctuates in an amount of less than or equal to 1 wt %, preferably in an amount of less than or equal to 0.5 wt %, and more preferably in an amount of less than or equal to 0.25% over a period of time of 10 minutes to several months from a selected value for a delivery device that carries more than 0.5 kilograms of the liquid precursor compound, preferably more than 4 kilograms of the liquid precursor compound, and more preferably more than 10 kilograms of the liquid precursor compound. In one embodiment, the delivery device uses an amount of energy of greater than or equal to about 1 watt, preferably greater than or equal to about 3 watts, and more preferably greater than or equal to about 5 watts in order to vaporize the liquid precursor and deliver it to the reactor. The greatly reduced volume fluctuations in the delivery of the precursor compound translate into greatly reduced fluctuations over large amounts of time. The chemical vapor deposition (CVD) process relies on a uniform and known precursor compound per unit time feed. The present invention increases the precision of this feed from 10 wt % obtained with conventional devices to 0.2 wt % over large periods of time.

What is claimed is:

1. A delivery system for a liquid precursor compound comprising:
   a delivery device having an inlet port and an outlet port;
   a first proportional valve;
   a second proportional valve;
   a physical-chemical sensor; the physical-chemical sensor being disposed downstream of the delivery device and being operative to analyze chemical contents of a fluid stream emanating from the delivery device; the physical-chemical sensor being in communication with the first proportional valve;
   a first controller being in operative communication with the physical-chemical sensor and with the first proportional valve;
   a pressure sensor in fluid communication with the delivery device;
   a second controller being in operative communication with the pressure sensor and in electrical communication with the second proportional valve; and
   a scale, wherein the delivery device is disposed on the scale to determine the amount of liquid precursor compound contained in the delivery device;
   wherein the delivery system is operative to deliver a substantially constant number of moles of a liquid precursor compound vapor per unit volume of a carrier gas to a plurality of reactors that are communication with the delivery system; the liquid precursor compound being in a liquid state in the delivery device; where the first proportional valve is in electrical communication with the first controller; wherein the first proportional valve is operative to control the flow of the carrier gas based on an applied voltage.

2. The delivery system of claim 1, where the first controller, the first proportional valve, the delivery device and the physical-chemical sensor lie in a first closed loop.

3. The delivery system of claim 1, where the second controller, the second proportional valve and the pressure sensor lie in a second closed loop.

4. The delivery system of claim 1, where the delivery system is operative to deliver vapor of the liquid precursor compound at a rate greater than or equal to 0.1 grams per minute at a carrier gas flow rate of greater than or equal to 0.2 standard liters per minute at a temperature of minus 10° C. to 200° C. and a pressure of greater than or equal to 100 kilopascals.

5. The delivery system of claim 1, where the delivery system is operative to maintain a precise vapor concentration within ±0.5 wt % from a set point and deliver the precursor vapor to the plurality of reactors.

6. The delivery system of claim 1, where all flows in the delivery system are unidirectional and none of the flows are opposed to each other.

7. The delivery system of claim 1, wherein the first proportional valve is disposed upstream of the delivery device.

8. The delivery system of claim 1, wherein the first proportional valve is disposed downstream of the delivery device.

* * * * *